United States Patent [19]

Knoll et al.

[11] Patent Number: 5,255,161
[45] Date of Patent: Oct. 19, 1993

[54] WIRE GUIDE ELEMENT FOR A DISTRIBUTOR UNIT IN TELECOMMUNICATION SYSTEMS

[75] Inventors: Rudolf Knoll, Berg; Peter Stoerk, Eurasburg, both of Fed. Rep. of Germany

[73] Assignee: Siemens Aktiengesellschaft, Munich, Fed. Rep. of Germany

[21] Appl. No.: 804,365

[22] Filed: Dec. 10, 1991

[30] Foreign Application Priority Data

Dec. 19, 1990 [DE] Fed. Rep. of Germany ... 9017155[U]

[51] Int. Cl.⁵ .......................... H02G 9/04; H02B 1/20
[52] U.S. Cl. ..................................... 361/826; 174/38; 361/829; 379/327
[58] Field of Search ................ 174/38, 44, 48, 49, 174/68.1, 72 A, 72 B, 77 R, 95–101; 211/26; 361/334, 340, 390, 391, 394, 428, 429; 379/326, 327, 329, 330; 439/532, 709, 715, 716, 718, 727, 719

[56] References Cited

U.S. PATENT DOCUMENTS

| | | | |
|---|---|---|---|
| 4,278,315 | 7/1981 | Osborne | 361/428 |
| 4,371,757 | 2/1983 | Debortoli et al. | 361/428 |
| 4,470,102 | 9/1984 | De Luca et al. | 361/428 |
| 5,153,819 | 10/1992 | Hebel | 361/428 |

FOREIGN PATENT DOCUMENTS

| | | |
|---|---|---|
| 0109881 | 5/1984 | European Pat. Off. |
| 9017155 | 3/1991 | Fed. Rep. of Germany |
| 1604898 | 4/1972 | France |

*Primary Examiner*—Leo P. Picard
*Assistant Examiner*—D. Sparks

[57] ABSTRACT

Wire guide element for a distributor unit in telecommunication systems. The plug connector strips of the distributor unit are secured to the edges of a vertically aligned U-shaped carrier part. A hollow plastic member is used as a wire guide element for the lines proceeding between neighboring distributor units arranged at both sides. With the guide peg present at the under side, this hollow plastic member is plugged, on the one end, onto the upper edge of the leg of the carrier part and, on the other hand, is snapped onto the retainer plate joined in this region to the carrier part at the back side. At least one hook attached to the upper side parallel to the plate also serves for the ordered guidance of lines. At its front side, the hollow member has a slot specifically designed for the insertion of lines.

20 Claims, 3 Drawing Sheets

WIRE GUIDE ELEMENT FOR A DISTRIBUTOR UNIT IN TELECOMMUNICATION SYSTEMS

BACKGROUND OF THE INVENTION

The present invention is directed to a wire guide element for a distributor unit in telecommunication systems that is composed of an oblong and essentially U-shaped carrier part for accepting plug connector strips for connecting and joining outgoing and incoming lines. This carrier part is in turn brought into a ready-to-use installation state on the basis of a retainer element firmly connectable thereto given longitudinally vertical alignment. An expansion is possible on the basis of at least one identical distributor unit to be attached laterally and line leads proceed between respectively two such neighboring distributor units. A separate cover hood can be put in place on each distributor unit.

Such a distributor unit serves the purpose of running patching wires from any arbitrary terminal point of the plug connector strips for incoming lines to any arbitrary terminal point of the plug connector strips for the outgoing lines leading for, example, to the switching equipment. In modern distributor systems a surveyable wiring arrangement must be provided even for increasing wiring density. In order to achieve such an ordered laying of lines, for example, hook-shaped or bow-shaped wire guide elements are arranged in the region of the wire guide waves that are provided. Given a correspondingly high number of subscribers, a distributor unit may also be expanded by identical distributor units to be arranged in immediate adjacency at both sides.

SUMMARY OF THE INVENTION

It is an object of the present invention to enable an optimum guidance of the lines to be laid between the distributor units on the basis of correspondingly matched and placed guide elements. This is achieved in that the wire guide element is fashioned as a plastic part and, for the purpose of forming a transverse channel between two immediately adjoining sub-units, represents a hollow member open at two opposite sides whose lower wall region has outwardly directed guide pegs with which it can be directly plugged onto the face edge of every leg of the carrier part open toward the front. A mechanical connection to the retainer element projecting beyond the carrier part in the longitudinal direction occurs by fastening elements attached to the back side.

The wire guide element can be cost-beneficially manufactured in plastic and can be secured in the face end region with adequate stability in a simple way. In addition to the space established by the hollow member, additional lines can be conducted at the wire guide element on the basis of pin-shaped or hook-shaped projections applied to the outside wall.

In accordance with the development of the present invention, a hook-like formed portion that continues in a finger-like, resilient tab is provided as fastening element at the back side. A cut-out is provided at the plate serving as retainer element, being provided in the region of each and every leg. For mechanical joining, the hook-like formed portion embraces the lower edge of the cut-out and the resilient tab snaps in under the upper edge of this cut-out.

The wire guide element placed on the face edge of the carrier part is thus held with adequate stability in an extremely simple way. The guide element is locked after the snap-in of the resilient tab. This locking is inventively promoted by a rib applied to the resilient end of the tab. According to a development of the present invention, the wire guide element that, after fastening, has its open sides directed in the direction of the distributor units neighboring one another has a slot pointing in this same direction at the wall surface accessible from the front.

As a result thereof, the conductors can be placed into the wire guide element in a simple way.

A particular ease of insertion results in that, given a rectangular cross section of the hollow member, the slot is provided in the region of the upper edge of the upper and front wall parts that abut one another.

The insertion of the lines is also additionally facilitated in that, for forming the slot, the upper part of the front wall surface points obliquely inward in the direction toward the upper side.

The development of the present invention is that the wire guide element has such an extent in the transverse direction defined by the open sides that it engages at least beyond the lateral limits respectively established by a cover hood and into the immediately adjoining distributor unit, whereby a cut-out matched to the dimensions of the wire guide element is provided in every side wall of the cover hood.

The line wires laid between the neighboring distributor units are thus protected against injury in the region of this covering in a simple way.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
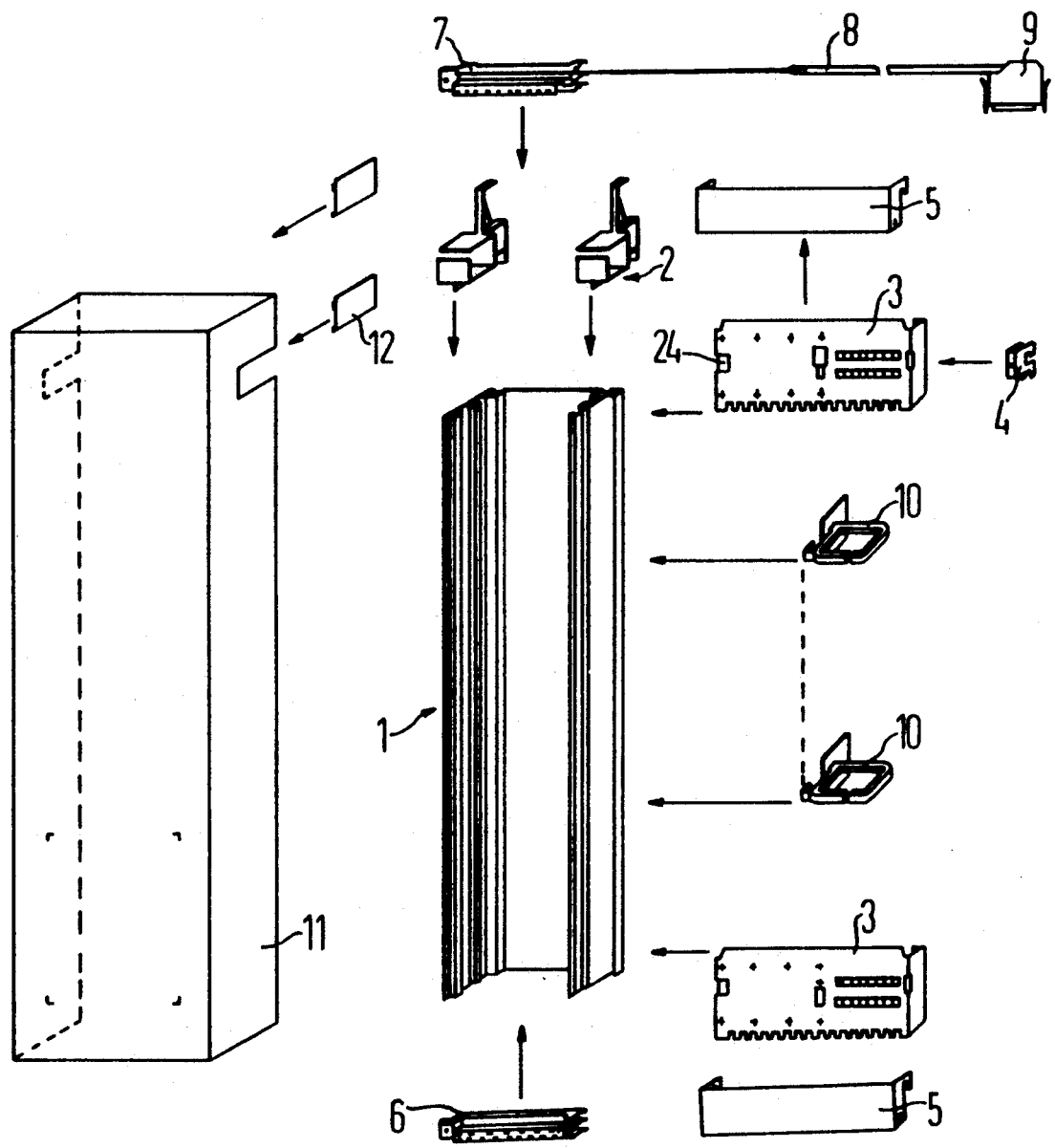
FIG. 1 is a perspective exploded view of a distributor unit.

According to FIG. 1, the basic unit provided, for example, for mounting at a wall is composed of the carrier part 1 and of the plate 3 connectable thereto in the upper and lower region. The carrier part is fashioned U-shaped and is manufactured as an extruded profile, whereby any desired length dimension is then respectively possible by simply cutting off from the extended material. On the basis of a corresponding design of the free edge of each and every leg of this U-form of the carrier part, the plug connector strip 6 or, respectively, 7 can be secured to these edges. To this end, for example, the free edge of the one leg can comprise a through, potentially slightly inwardly inclined completely cylindrical form. A plug connector strip that has its end face provided with a cut-out adapted thereto is then plugged onto this completely cylindrical form. The other leg comprises a through screw channel at the free edge. After the plug connector strip is plugged onto the fully cylindrically fashioned edge of the other leg, the respective plug connector strip is to be put in place onto the edges of the screw channel at any arbitrary location at the long side of the carrier part, for example with a flange attached in said plug connector strip. Given a corresponding perforation of the flange, the plug connector strip can be secured to the carrier part 1 in the screw channel with a self-taping screw. For forming a distributor block, the carrier part accepts (in the way just set forth) a plurality of plug connector strips 6 or, respectively, 7 that have their long sides following one another. For example, plug connector strips 7 wherein terminal elements are provided at the long sides lying opposite one another can be employed as plug connector strips 7. In accord therewith, for example, the terminal elements for the lines that lead to the switching equipment and that are seldom rearranged are arranged at the back side of the strip. These lines of the internal side outgoing as cable 8 can already be connected at the factory. They are connected to a plug device 9 for contacting to the cooperating contacts present in the switching equipment. The terminal elements for the external side, i.e. for the subscriber lines, continue to be provided at the front, servicing side of the strip. These terminal elements are thus easily accessible, so that alterations in the occupation of the strip can be undertaken without further ado. For the ordered guidance of the lines, bow-shaped or hook-shaped wire guide elements 10 are to be snapped in place in a simple way at the one leg of the U-shaped profile. A vertical channel for guiding the lines is thus available with these elements.

For fastening to the wall, the carrier part 1 has its upper and its lower end screwed to a plate 3 fashioned C-shaped. This plate projects beyond the carrier part 1 both in longitudinal direction as well as at one side. With such a plate, a defined spacing between the distributor block and a wall surface can be observed after installation. Cables are to be guided in this wall spacing region. On the basis of appropriate clips 4, the perforations present in the laterally projecting part of the plate 3 serve the purpose of fastening the cables laterally held by the wire guide elements 10. After, for example, being deflected from above into the space prescribed by the carrier part 1, the appertaining conductors are then conducted to the plug connector strip 7. The illustration of FIG. 1 also shows a rail-like element 5 that serves the purpose of fastening accessory equipment. In its normal position, it is hooked to the upper edge of the plate 3. After being completely equipped, a distributor unit can be provided with a cover hood 11. This cover hood 11 comprises recesses at both sides that are to be covered with inserted and locked plastic parts 12. These recesses serve the purpose of enabling transverse channels when a distributor unit is expanded by an identical distributor unit to be respectively arranged in immediate lateral proximity.

Figure 2:
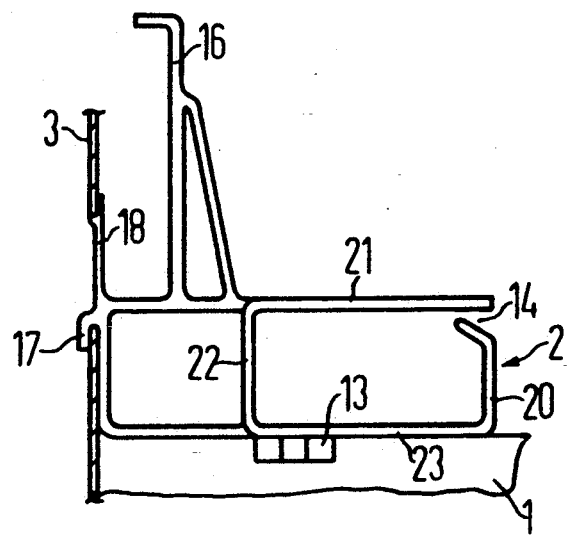
FIGS. 2 and 3 are two views of the wire guide element.
Figure 3:
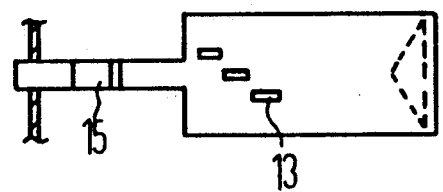
Figure 4:
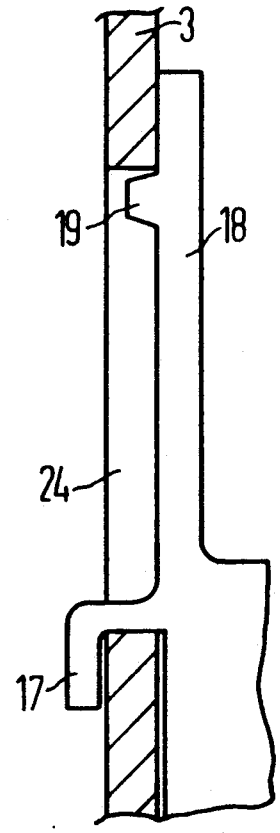
FIG. 4 depicts an enlarged portion of the fastening element.

FIGS. 2 through 4 show details of the wire guide element 2 implacable onto the face edge of the carrier part 1. Lines are conducted through and the rectangular cavity surrounded by its walls 20 through 23 or, respectively, are introduced from the front through the slot 14 into the hollow member. For forming the slot 14 present at the upper front side, the free upper edge of the wall surface 20 is guided obliquely inward to the upper limiting surface. The edges of the part directed inward and in an arcuate angle at the middle, as may be derived from FIG. 3. The front wall part 20 is resiliently fashioned so that, in combination with the shape of the slot 14, the introduction of cables or, respectively, lines becomes unproblematical.

The guide pegs 13 on the under side of the wire guide element 2, as well as, the hook 17 arranged at the back side thereof in combination with the resilient tab 18 serve the purpose of attaching the wire guide element 2 to the face edge of a leg of the carrier part 1. In the exemplary embodiment, these fastening elements are applied to a web 15 that in turn departs from the backside wall 22 of the hollow member. Dependent on the desired dimensioning of this hollow member, these fastening elements could also be secured directly to the back-side wall part 22.

The multiply provided guide pegs 13 are offset relative to one another in accord with the shaping of the leg of the carrier part. When the wire guide element 2 is put in place, these pegs embrace the upper edge of the profile. The hook 17 is introduced into the cut-out 24 that is provided in the plate 3. The wire guide element 2 is moved downward until the hook 17 embraces the lower edge of the cut-out 24. During this emplacement motion, the resilient tab 18 is first conducted along the corresponding wall of the plate 3, whereby it supports itself with a defined spring power. When the final position is reached, the resilient tab 18 snaps into the cut-out 24 at the upper edge of the cut-out 24 with its rib 19 applied to it. A locking is thus achieved, so that the wire guide element can only be removed after a simple, manual unlocking. The final position that has been assumed is thus secured by the said fastening elements in combination with the guide pegs 13.

The fastening elements composed of the hook 17 and the resilient tab 18 with which the fastening to the plate 3 is undertaken are again shown excerpted in FIG. 4 in an enlarged scale.

A hook-shaped formed portion 16 that has a defined spacing from the plate 3 is additionally provided at the upper side of the wire guide element 2. Cables or, respectively, conductors can likewise be guided in this space between the plate 3 and the hook-like shaped portion 16. This, for example, prevents such conductors from tilting over toward the front side.

Figure 5:
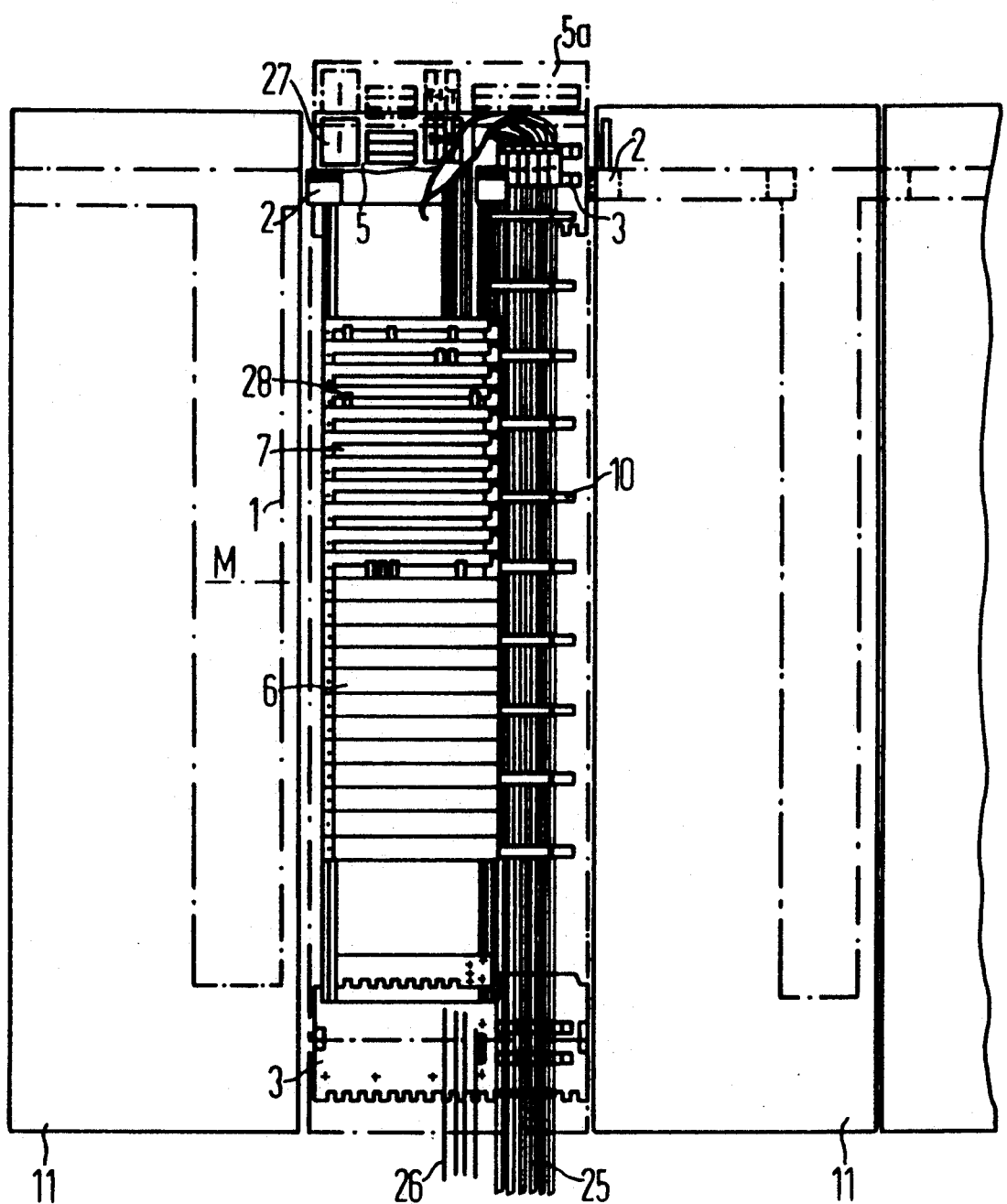
FIG. 5 is a plan view of the front side of a distributor unit.

The equipping of the distributor unit with the individual elements is indicated in the distributor unit shown without cover hood in FIG. 5. Proceeding from a prescribed marking line M, a field of plug connector strips 7 is present above this line and these, for example, are allocated to the internal side as separating or disconnect strips. The conductors 25 to be connected to these strips, consequently, lead to the switching equipment. As already mentioned, these lines are secured with, for example, spring clips 4 to the plate 3 that laterally extends beyond the profile of the carrier part 1. The insertion, contacting and fastening onto the plates 3 is provided away from the profile in order to avoid threading given a later expansion. Proceeding from the fastening location at the upper plate 3, the individual conductors are guided from above to the separating or disconnect strip 7 and are connected to the terminal elements thereof. These terminal elements are usually fashioned as clamp elements that allow a stripping-free connection of the electrical conductors. For example, the conductors leading to the switching equipment can be connected to the terminal elements provided a the under side of the separating or disconnect strip. The terminal elements present at the upper side thereof are then present for the variable connections to be occupied within the scope of what is referred to as jumpering. These are easily accessible from the front. Protective plugs 28 are to be plugged as needed onto the plug connector strip 7 allocated to the internal side.

Jumpering is then not undertaken directly with the conductors of the internal cable 26; rather, the conductors are clamped to terminal elements of the strapping connectors 6 arranged under the marking line M. The actual jumpering is then undertaken between the terminal elements of the separating or disconnect strips respectively present at the front side and the terminal elements of the strapping connectors. As a result of the division of the strip fields ensuing proceeding from a defined marking M, the expansion to be undertaken gradually, for example, in accord with the increase in the number of subscribers is facilitated when expansion is undertaken in downward or, respectively, in upward direction proceeding from this marking. The plug connector strips are independent of the wire guides and can be subsequently introduced.

The rail 5 equipped with accessory equipment 27 is hooked in above the carrier part 1 at the plate 3 screwed to the back side thereof. This rail 5 is shown broken so that the conductors normally covered by it are visible. The position 5a of this rail corresponds to the parking position that can be assembled by being simply plugged onto the edge of the plate 3.

In the exemplary embodiment of FIG. 4, further distributor units are provided at both sides at the distributor unit shown without cover hood. The wire guide elements 2 that, for example, are respectively put in place at the face edge of the leg immediately neighboring the adjoining distributor unit engage somewhat into the respectively other distributor unit. As a result thereof, the lines proceeding between the individual distributor units cannot be injured by the cut-out edges of the respective cover hoods 11.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A wire guide element for distributor units in telecommunication systems, each of the distributor units having an oblong and substantially U-shaped carrier part that accepts plug connector strips for connecting and joining outgoing and incoming lines, at least one retainer element attached to a first end of the carrier part, the carrier part having legs, whereby line leads proceed between distributor units respectively arranged neighboring one another and whereby a separate cover hood is provided for each distributor unit, comprising:
   a non-metallic hollow member having open opposed sides, and at least a rear wall and a lower wall, said lower wall having at least one outwardly projecting guide peg that plugs onto an end face of a respective leg of the legs of the carrier part at a first end thereof; and
   a fastening element attached to said rear wall of said hollow member, said fastening element forming a mechanical connection with the retainer element that is connected to the first end of the carrier part; wherein said hollow member forms a transverse channel between respective neighboring distributor units for the line leads.

2. The wire guide element according to claim 1, wherein the fastening element has a hook-like shaped portion on a back side thereof and a finger-like, resilient tab attached top said hook-like shaped portion; wherein the retainer element has a plate with a cut-out that is provided in the region of the respective leg of the carrier part; and wherein, for mechanical connection, the hook-like shaped portion embraces a lower edge of the cut-out and the resilient tab snaps into the cut-out under and upper edge of the cut-out.

3. The wire guide element according to claim 2, wherein an end region of the resilient tab has an outwardly directed rib that engages into the cut-out under the upper edge of the cut-out.

4. The wire guide element according to claim 1, wherein when the wire guide element is attached to the carrier part, the wire guide element has open sides thereof aligned in a predetermined direction toward the distributor units neighboring one another; and wherein the guide element has a slot that is parallel to the predetermined direction at a wall surfaces of the hollow member, the slot being accessible from the front of the hollow member.

5. The wire guide element according to claim 4, wherein the hollow member has a rectangular cross section and further has an upper wall and a front wall; and wherein the slot is provided in an upper region of the front wall adjacent the upper wall.

6. The wire guide element according to claim 5, wherein for forming said slot, an upper part of the front wall is directed obliquely inward in a direction toward the upper wall.

7. The wire guide element according to claim 1, wherein each cover hood has side walls, wherein said wire guide element has a length in a transverse direction defined by the open sides thereof such that the wire guide element engages at least beyond limits established by a respective cover hood and into the distributor units neighboring one another, whereby a cut-out adapted to the dimensions of the wire guide element is provided at every side wall of a respective cover hood.

8. The wire guide element according to claim 1, wherein at least two guide pegs are provided on the lower wall, said at least two guide pegs being laterally offset relative to one another in accordance with a predetermined profile and embracing an edge of the end face of the respective leg of the carrier part.

9. The wire guide element according to claim 8, wherein at least two guide pegs are provided on the lower wall, said at least two guide pegs having laterally offset relative to one another in accordance with a predetermined profile and embracing an edge of the end face of the respective leg of the carrier part.

10. The wire guide element according to claim 1, wherein said wire guide element further comprises a hook-shaped and approximately perpendicularly upwardly directed formed portion in a rear region of the wire guide element.

11. The wire guide element according to claim 1, wherein the front wall of the wire guide element has means for attachment thereto of a label.

12. A wire guide element for distributor units in telecommunication systems, each of the distributor units having an oblong and substantially U-shaped carrier part that accepts plug connector strips for connecting and joining outgoing and incoming lines, at least one retainer element attached to a first end of the carrier part, the carrier part having legs, whereby line leads proceed between distributor units respectively arranged neighboring one another and whereby a separate cover hood is provided for each distributor unit, comprising:

- a non-metallic hollow member having open opposed sides, and at least a rear wall and a lower wall, said lower wall having at least one outwardly projecting guide peg that plugs onto an end face of a respective leg of the legs of the carrier part at a first end thereof;
- a fastening element attached to said rear wall of said hollow member, said fastening element forming a mechanical connection with the retainer element that is connected to the first end of the carrier part;
- the fastening element having a hook-like shaped portion on a back side thereof and a finger-like, resilient tab attached to said hook-like shaped portion;
- the retainer element being a plate with a cut-out that is provided in the region of the respective leg of the carrier part wherein for mechanical connection, the hook-like shaped portion embraces a lower edge of the cut-out of the cut-out, an end region of the resilient tab having an outwardly directed rib that engages under the upper edge of the cut-out;
- when the wire guide element is attached to the carrier part, the wire guide element having the open sides thereof aligned in a predetermined direction toward the distributor units neighboring one another; and
- a slot that is parallel to the predetermined direction at a wall surface of the hollow member, the slot being accessible from the front of the hollow member;
- wherein said hollow member forms a transverse channel between respective neighboring distributor units for the line leads.

13. The wire guide element according to claim 12, wherein the hollow member has a rectangular cross section and further has an upper wall and a front wall; and wherein the slot is provided in an upper region of the front wall adjacent the upper wall.

14. The wire guide element according to claim 13, wherein for forming said slot, an upper part of the front wall is directed obliquely inward in a direction toward the upper wall.

15. The wire guide element according to claim 12, wherein each cover hood has side walls, wherein said wire guide element has a length in a transverse direction defined by the open sides thereof such that the wire guide element engages at least beyond limits established by a respective cover hood and into the distributor units neighboring one another, whereby a cut-out adapted to the dimensions of the wire guide element is provided at every side wall of a respective cover hood.

16. The wire guide element according to claim 12, wherein said wire guide element further comprises a hook-shaped and approximately perpendicularly upwardly directed formed portion in a rear region of the wire guide element.

17. A wire guide element for distributor units in telecommunication systems, each of the distributor units having an oblong and substantially U-shaped carrier part that accepts plug connector strips for connecting and joining outgoing and incoming lines, at least one retainer element attached to a first end of the carrier part, the carrier part having legs, whereby line leads proceed between distributor units respectively arranged neighboring one another and whereby a separate cover hood is provided for each distributor unit, comprising:

- a non-metallic substantially rectangular hollow member having open opposed sides, and front, rear, upper and lower walls, said lower wall having at least one outwardly projecting guide peg that plugs onto an end face of a respective leg of the legs of the carrier part at a first end thereof;
- a fastening element attached to said rear wall of said hollow member, said fastening element forming a mechanical connection with the retainer element that is connected to the first end of the carrier part;
- the fastening element having a hook-like shaped portion on a back side thereof and a finger-like, resilient tab attached to said hook-like shaped portion;
- the retainer element having a plate with a cut-out that is provided in the region of the respective leg of the carrier part wherein, for mechanical connection, the hook-liked shaped portion embraces a lower edge of the cut-out and the resilient tab snaps into the cut-out under and upper edge of the cut-out, an end region of the resilient tab having an outwardly directed rib that engages under the upper edge of the cut-out;
- when the wire guide element is attached to the carrier part, the wire guide element having the open sides thereof aligned in a predetermined direction toward the distributor units neighboring one another; and
- a slot that is parallel to the predetermined direction, said slot being formed by an upper part of the front wall that is directed obliquely inward in a direction toward the upper wall;
- wherein said hollow member forms a transverse channel between respective neighboring distributor units for the line leads.

18. The wire guide element according to claim 17, wherein each cover hood has side walls, wherein said wire guide element has a length in a transverse direction defined by the open sides thereof such that the wire guide element engages at least beyond limits established by a respective cover hood and into the distributor units neighboring one another, whereby a cut-out adapted to the dimensions of the wire guide element is provided at every side wall of a respective cover hood.

19. The wire guide element according to claim 17, wherein at least two guide pegs are provided on the lower wall, said at least two guide pegs being laterally offset relative to one another in accordance with a predetermined profile and embracing an edge of the end face of the respective leg of the carrier part.

20. The wire guide element according to claim 17, wherein said wire guide element further comprises a hook-shaped and approximately perpendicularly upwardly directed formed portion in a rear region of the wire guide element.

* * * * *